(12) United States Patent
Jung et al.

(10) Patent No.: US 7,764,092 B2
(45) Date of Patent: Jul. 27, 2010

(54) PHASE LOCKED LOOP AND PHASE LOCKING METHOD

(75) Inventors: Woo-Young Jung, Yongin-si (KR); Young-Min Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/080,012

(22) Filed: Mar. 31, 2008

(65) Prior Publication Data
US 2008/0186066 A1 Aug. 7, 2008

Related U.S. Application Data

(63) Continuation-in-part of application No. 11/646,101, filed on Dec. 27, 2006, now abandoned.

(30) Foreign Application Priority Data

Jan. 10, 2006 (KR) ............... 10-2006-0002714
Apr. 6, 2007 (KR) ............... 10-2007-0034328

(51) Int. Cl.
*H03L 7/06* (2006.01)

(52) U.S. Cl. ............... 327/147; 327/148; 327/156; 327/157

(58) Field of Classification Search ............... None
See application file for complete search history.

(56) References Cited

U.S. PATENT DOCUMENTS

| 5,903,195 | A  | * | 5/1999  | Lukes et al. ............... 331/4 |
| 6,052,025 | A  |   | 4/2000  | Chang et al. |
| 6,456,165 | B1 | * | 9/2002  | Kelkar ............... 331/17 |
| 6,466,100 | B2 | * | 10/2002 | Mullgrav et al. ............... 331/179 |
| 6,669,882 | B2 |   | 12/2003 | Seok |
| 6,781,469 | B2 | * | 8/2004  | Ho et al. ............... 331/16 |
| 6,919,769 | B2 |   | 7/2005  | Lim et al. |
| 6,975,148 | B2 |   | 12/2005 | Miyata et al. |
| 7,095,260 | B2 |   | 8/2006  | Miyata et al. |
| 7,148,757 | B2 | * | 12/2006 | Chiu ............... 331/16 |
| 7,253,691 | B2 | * | 8/2007  | Okada ............... 331/1 A |
| 7,355,486 | B2 | * | 4/2008  | Kelkar et al. ............... 331/16 |
| 2002/0089381 | A1 | * | 7/2002 | Mullgrav et al. ............... 331/17 |
| 2003/0206042 | A1 | * | 11/2003 | Walker et al. ............... 327/156 |
| 2004/0051591 | A1 | * | 3/2004 | Okada ............... 331/16 |
| 2004/0119544 | A1 | * | 6/2004 | Lee et al. ............... 331/16 |
| 2004/0136440 | A1 | * | 7/2004 | Miyata et al. ............... 375/130 |

(Continued)

FOREIGN PATENT DOCUMENTS

JP 2001-203570 7/2001

(Continued)

*Primary Examiner*—Tuan Lam
*Assistant Examiner*—Hiep Nguyen
(74) *Attorney, Agent, or Firm*—Mills & Onello, LLP (57) ABSTRACT

A phase locked loop includes a charge pump, a voltage-current converter, and a current controlled oscillator. The charge pump generates a pump current based on a bias voltage and a phase difference detection signal, in which the pump current is for adjusting a control voltage. The voltage-current converter is self-biased, generates the bias voltage, and converts the control voltage to a converter current. The current controlled oscillator generates an oscillator current based on the bias voltage, and generates an output signal that has a frequency corresponding to the oscillator current. The phase locked loop is insensitive to a division ratio and PVT variations.

16 Claims, 8 Drawing Sheets

U.S. PATENT DOCUMENTS

| | | | | |
|---|---|---|---|---|
| 2005/0195301 A1* | 9/2005 | Horiuchi | .................... | 348/294 |
| 2009/0160511 A1* | 6/2009 | Sudo | ......................... | 327/157 |
| 2009/0316848 A1* | 12/2009 | Yu et al. | .................... | 375/376 |

FOREIGN PATENT DOCUMENTS

| | | |
|---|---|---|
| JP | 2001-203570 A | 7/2001 |
| JP | 2001-326574 A | 11/2001 |
| JP | 2004-328280 A | 11/2004 |
| KR | 10-2005-0054105 | 6/2005 |

* cited by examiner

PHASE LOCKED LOOP AND PHASE LOCKING METHOD

CROSS-REFERENCE TO RELATED APPLICATIONS

This application is a continuation-in-part of U.S. patent application Ser. No. 11/646,101, filed on Dec. 27, 2006, now pending, which claims priority under 35 USC §119 to Korean Patent Application No. 10-2006-0002714, filed on Jan. 10, 2006 in the Korean Intellectual Property Office (KIPO), the disclosures of which are incorporated herein in their entirety by reference. This application also claims priority under 35 USC §119 to Korean Patent Application No. 10-2007-0034328, filed on Apr. 6, 2007 in the KIPO, the disclosure of which is herein incorporated by reference in its entirety.

BACKGROUND OF THE INVENTION

1. Field of the Invention

The present invention relates to apparatuses and methods for locking a phase of an output signal, and more particularly to a phase locking method and a phase locked loop (PLL) that includes a self-biased voltage-current converter.

2. Description of the Related Art

A phase locked loop (PLL) capable of outputting a stable oscillating output having a frequency that is equal to a frequency of a reference signal or a frequency generated by dividing/multiplying the frequency of the reference signal is used in various ways. As examples, the PLL is widely used to generate various frequencies for an application specific integrated circuit (ASIC), a system on chip (SoC), and so on. Generally, a PLL includes a divider in a feedback path where a division ratio of the divider or a multiplication factor is a value of M. The PLL can generate a clock signal that has a relatively high frequency based on a reference signal that has a relatively low frequency, and can generate a clock signal that has a desired frequency by controlling the division ratio.

However, when using the divider, a frequency band and/or jitter characteristics of the PLL can vary according to the division ratio, and can be sensitive to process, voltage, and temperature (PVT) variations.

As the PLL is widely used in portable devices, requirements for reducing a size and a power consumption of the PLL become very important. Thus, PVT variations that affect the frequency band and/or the jitter characteristics should be considered weighty.

Figure 1:
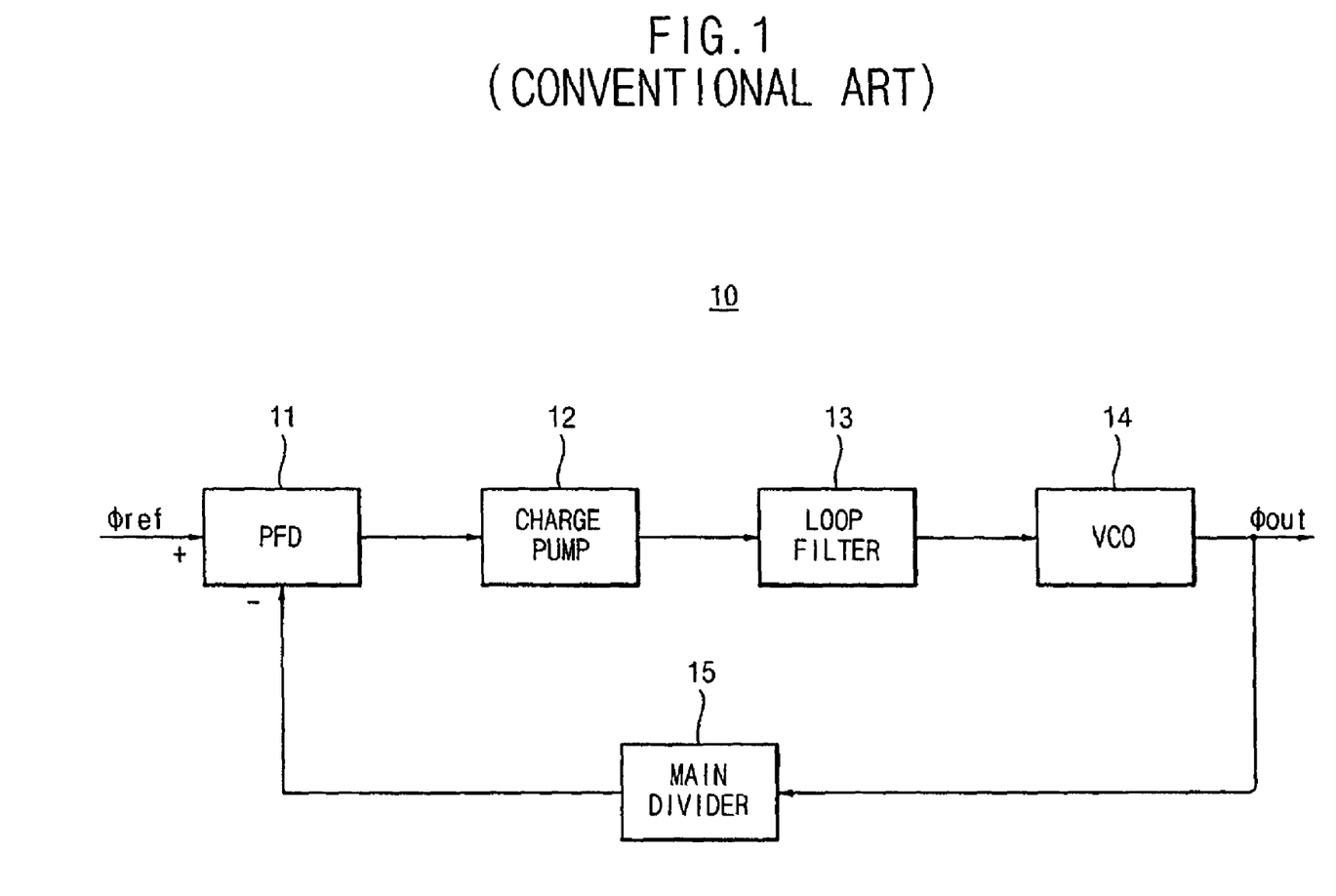
FIG. 1 is a block diagram illustrating a conventional phase locked loop (PLL).

FIG. 1 is a block diagram illustrating a conventional PLL. Referring to FIG. 1, the PLL 10 includes a phase frequency detector (PFD) 11, a charge pump 12, a loop filter 13, a voltage controlled oscillating (VCO) 14, and a main divider 15.

The PLL 10 receives a reference signal φref having a reference frequency, and generates an output signal φout of which a frequency is M times the reference frequency of the reference signal φref. The PFD 11 detects a phase difference between the reference signal φref and the output signal φout, generates an up signal or a down signal, and provides the up signal or the down signal to the charge pump 12. The charge pump 12 provides a predetermined current to the loop filter 13 according to the up signal or the down signal. The loop filter 13 receives the predetermined current, generates a control voltage to be supplied to the VCO 14, and maintains the voltage at a constant level. The VCO 14 receives the control voltage, and generates the output signal φout, of which the frequency is proportional to the control voltage. The main divider 15 receives the output signal φout, and generates a frequency-divided output signal, of which the frequency is 1/M times the frequency of the output signal φout. The frequency-divided output signal is applied to the PFD 11. As described above, the PLL 10 can generate the output signal φout, of which the frequency is maintained substantially constant.

A transfer function G1(s) of the PLL 10 is obtained as shown in Expression 1 below:

$$G1(s) = \frac{\phi out}{\phi ref}$$
$$= \frac{\frac{Icp}{2\pi} \cdot H(s) \cdot \frac{Kvco}{s}}{1 + \frac{Icp}{2\pi} \cdot H(s) \cdot \frac{Kvco}{s} \cdot \frac{1}{M}}$$
$$= \frac{\frac{Icp \cdot Kvco}{2\pi \cdot Clp} \cdot (1 + s \cdot Rlp \cdot Clp)}{s^2 + \frac{Icp \cdot Kvco \cdot Rlp}{2\pi \cdot M} \cdot s + \frac{Icp \cdot Kvco}{2\pi \cdot M \cdot Clp}}$$

$$H(s) \approx \frac{1 + s \cdot Rlp \cdot Clp}{s \cdot Clp}$$

[Expression 1]

where Icp indicates a pump current provided from the charge pump 12, H(s) indicates an approximate function of a transfer function of the loop filter 13, Kvco indicates a proportional constant of the VCO 14, Clp indicates a capacitance of the loop filter 13, Rlp indicates a resistance of the loop filter 13, φref indicates a phase of a reference signal, and φout indicates a phase of an output signal.

A bandwidth Δω of the PLL 10 is obtained as shown in Expression 2 below, which is taken from a denominator of the transfer function G1(s) in Expression 1.

$$\Delta w = \frac{Icp \cdot Kvco \cdot Rlp}{2\pi \cdot M}$$

[Expression 2]

Referring to Expression 2, the bandwidth Δω depends upon the pump current Icp provided from the charge pump 12, the resistance Rlp of the loop filter 13, the proportional constant Kvco of the VCO 14, and the division ratio M of the main divider 15. Thus, the PLL 10 is sensitive to PVT variations.

In addition, the loop filter in the PLL includes a large capacitor and a resistor. Generally, when a circuit is formed in a semiconductor chip, a capacitor occupies a large area in the semiconductor chip. If the resistance in the loop filter is increased to reduce a size of the capacitor in the loop filter, while maintaining the characteristic of the loop filter, the bandwidth of the PLL is also increased, as shown in Expression 2. If the pump current provided from the charge pump is reduced to reduce the size of the capacitor in the loop filter, while maintaining the bandwidth of the PLL, the characteristics of the PLL actually become difficult to preserve. In other words, reducing the size of the capacitor is not easy, and as a result, reducing the size of the PLL is difficult.

SUMMARY OF THE INVENTION

Some example embodiments in accordance with the present invention provide a phase locking method and a phase locked loop (PLL) that can be insensitive to a division ratio and process, voltage, and temperature (PVT) variations by generating a current corresponding to a loop dynamic.

Some example embodiments in accordance with the present invention provide a phase locking method and a phase locked loop that can be implemented in small size, that can be implemented at a low voltage, and that can reduce an operational range limit.

In accordance with some aspects of the present invention, provided is a phase locked loop that includes: a charge pump configured to generate a pump current based on a bias voltage and a phase difference detection signal, the pump current configured to adjust a control voltage; a self-biased voltage-current converter configured to generate the bias voltage, and configured to convert the control voltage to a converter current; and a current controlled oscillator configured to generate an oscillator current based on the bias voltage, and configured to generate an output signal that has a frequency corresponding to the oscillator current.

The pump current, the oscillator current, and the converter current can be proportional to each other.

The charge pump, the voltage-current converter, and the current controlled oscillator can include MOS transistors having a gate configured to receive the bias voltage.

Each proportional value of the pump current, the oscillator current, and the control current can be determined by a size of the each MOS transistor having a gate configured to receive the bias voltage.

The bias voltage can include a first bias voltage and a second bias voltage. And the voltage-current converter can include a bias unit that generates the first bias voltage and a first current that mirrors a current of the bias unit; an amplifying unit that generates the second bias voltage based on the first current by comparing the control voltage with a feedback voltage; and an output unit that generates the converter current and the feedback voltage based on the second bias voltage.

The voltage-current converter can further include a startup circuit configured to control the first bias voltage in an early stage of a system operation.

The bias unit can include: a first transistor that is diode-connected and configured to generate a voltage of a gate as the first bias voltage; a second transistor configured to form a CMOS structure with the first transistor, and that includes a gate configured to receive the second bias voltage; and a third transistor configured to form a current mirror with the first transistor to output the first current.

The amplifying unit can include a MOS differential pair that is connected to a common node configured to receive the first current, the MOS differential pair configured to receive the control voltage and the feedback voltage, and configured to generate a voltage of a drain as the second bias voltage; and a current mirror that is connected to the MOS differential pair.

The output unit can include a resistor and a MOS transistor that are connected in series. A gate of the MOS transistor can be configured to receive the second bias voltage, and the MOS transistor configured to generate a voltage of a drain as the feedback voltage.

The bias voltage can include a first bias voltage and a second bias voltage. The charge pump can include: a first current source configured to generate a first pump current based on the first bias voltage, a second current source configured to generate a second pump current based on the second bias voltage, and a switching unit that is connected between the first current source and the second current source, and configured to select one of the first pump current and the second pump current as the pump current based on the phase difference detection signal.

The first bias voltage and the second bias voltage can be changed according to the control voltage.

The current controlled oscillator can include a current source configured to generate the oscillator current that is proportional to the converter current based on the bias voltage, and an oscillating unit configured to generate the output signal based on the oscillator current.

In accordance with another aspect of the present invention, provided is a method of locking a phase of an output signal that includes: generating a pump current for adjusting a control voltage based on a bias voltage and a phase difference detection signal; converting the control voltage to a converter current by generating the bias voltage using is self-biasing, generating an oscillator current based on the bias voltage; and generating the output signal with a frequency corresponding to the oscillator current.

The pump current, the oscillator current, and the converter current can be proportional to each other.

The pump current can be generated by a charge pump, the control voltage can be converted to a converter current by a voltage-current converter, and the oscillator current can be generated by a current controlled oscillator, each of which includes MOS transistors having a gate configured to receive the bias voltage, wherein the method includes generating the pump current, converting the control voltage to the converter current, and generating the oscillator current can include applying the bias voltage to a gate of each MOS transistor, and controlling a size of the each MOS transistor in order to decide each proportional value of the pump current, the oscillator current, and the control current.

The bias voltage can include a first bias voltage and a second bias voltage. And converting the control voltage to the converter current can include generating a reference current using the first bias voltage and the second bias voltage; generating a first current by mirroring the reference current; generating the second bias voltage based on the first current by comparing the control voltage with a feedback voltage; and generating the converter current and the feedback voltage based on the second bias voltage.

Generating the second bias voltage can include comparing the control voltage with the feedback voltage by using a MOS differential pair that is connected to a common node that receives the first current, and generating a voltage of a drain of a transistor in the MOS differential pair as the second bias voltage. The transistor receives the control voltage.

The bias voltage can include a first bias voltage and a second bias voltage. Generating the pump current can include generating a first pump current based on the first bias voltage, generating a second pump current based on the second bias voltage, and selecting one of the first pump current and the second pump current based on the phase difference detection signal.

The first bias voltage and the second bias voltage can be changed according to the control voltage.

In accordance with another aspect of the invention there is provided a method of locking a phase of an output signal. The method comprises: generating a pump current based on a bias voltage and a phase difference detection signal, the pump current configured for adjusting a control voltage; converting the control voltage to a converter current by generating the bias voltage using self-biasing; generating an oscillator current based on the bias voltage; and generating the output signal with a frequency corresponding to the oscillator current. The pump current, the oscillator current, and the converter current are proportional to each other. And the bias voltage includes a first bias voltage and a second bias voltage, and generating the pump current includes: generating a first pump current based on the first bias voltage; generating a second pump current based on the second bias voltage; and selecting one of the first pump current and the second pump current based on the phase difference detection signal.

Accordingly, the phase locking method and the phase locked loop are insensitive to the division ratio and the PVT variations. In addition, the phase locking method and the phase locked loop are implemented in small size, operate at a low voltage, and reduce an operational range limit.

BRIEF DESCRIPTION OF THE DRAWINGS

The drawing figures depict preferred embodiments by way of example, not by way of limitations. In the figures, like reference numerals refer to the same or similar elements.

DESCRIPTION OF THE EMBODIMENTS

In the detailed illustrative embodiments disclosed herein, specific structural, and functional details are merely representative for purposes of describing aspects of the present invention. This invention can, however, be embodied in many alternate forms and should not be construed as limited to the embodiments set forth herein.

Accordingly, while the invention and embodiments are susceptible to various modifications and alternative forms, the specific embodiments herein are shown by way of example in the drawings and will herein be described in detail. It should be understood, however, that there is no intent to limit the invention to the particular embodiments disclosed herein, but on the contrary, the invention is to cover all modifications, equivalents, and alternatives falling within the spirit and scope of this disclosure and the claims.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, the accompanying drawings and the example embodiments thereof will be explained.

Figure 2:
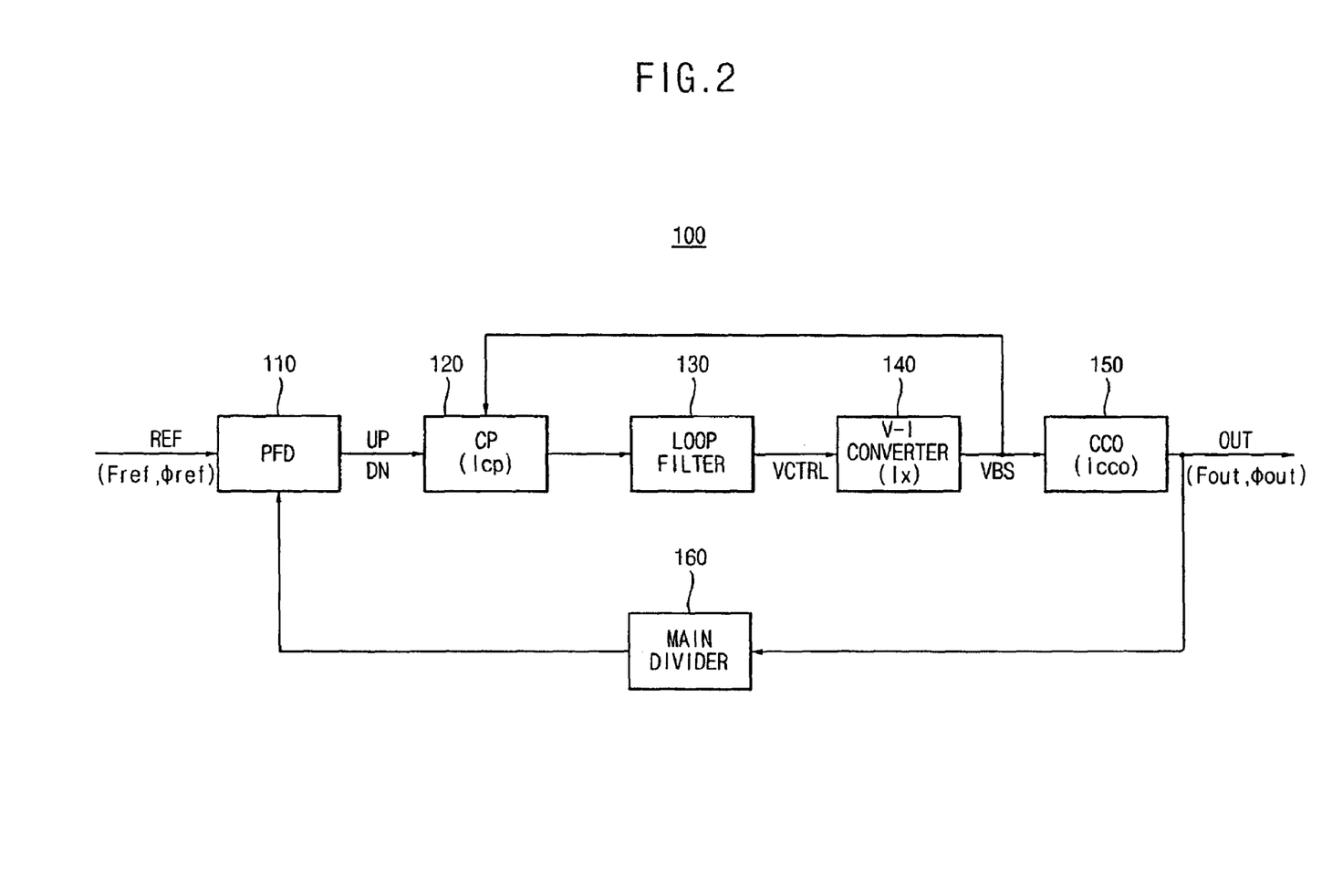
FIG. 2 is a block diagram illustrating an example embodiment of a PLL in accordance with aspects of the present invention.

FIG. 2 is a block diagram illustrating an example embodiment of a PLL according to the present invention. Referring to FIG. 2, the PLL 100 can include a phase frequency detector (PFD) 110, a charge pump 120, a loop filter 130, a voltage-current converter 140, a current controlled oscillator (CCO) 150, and a main divider 160.

The PLL 110 receives a reference signal REF having a frequency Fref, and generates an output signal OUT having a frequency Fout that is M times the frequency Fref of the reference signal REF. The PFD 110 detects a difference between a phase $\phi$ref of the reference signal REF and a phase $\phi$out of the output signal OUT, generates a phase difference detection signal UP and DN, and provides the phase difference detection signal UP and DN to the charge pump 120.

The charge pump 120 generates a pump current Icp based on a bias voltage VBS and the phase difference detection signal UP and DN. The pump current Icp adjusts a control voltage VCTRL. The voltage-current converter 140 has a self-biased structure, generates the bias voltage VBS, and converts the control voltage VCTRL to a converter current Ix. The CCO 150 generates an oscillator current Icco based on the bias voltage VBS, and generates the output signal OUT having the frequency Fout corresponding to the oscillator current Icco.

The loop filter 130 is connected between the charge pump 120 and the voltage-current converter 140, and maintains the control voltage VCTRL constant. The divider 160 divides a frequency Fout of the output signal OUT by M. The frequency-divided output signal is applied to the PFD 110. The PLL 100 can generate the output signal OUT having the frequency Fout that is maintained constant.

A conventional PLL includes a bias block that supplies a bias voltage. However, the PLL 100 according to this example embodiment does not need any bias block that supplies a bias voltage. That is, the voltage-current converter 140 generates the bias voltage VBS by itself, and each of the charge pump 120, the voltage-current converter 140, and the current controlled oscillator 150 operates based on the bias voltage VBS. Since the PLL 100 uses the common bias voltage VBS, each of the pump current Icp, the oscillator current Ix, and the converter current Icco is proportional to each other. The proportional relationship among the currents is obtained as shown in Expression 3 below.

$$Icco = \alpha \cdot Ix$$

$$Icp = \beta \cdot Ix \qquad \text{[Expression 3]}$$

For example, the proportional relationship as shown in Expression 3 can be implemented with a PLL that includes the charge pump 120, the voltage-current converter 140, and current controlled oscillator 150. Each of the charge pump 120, the voltage-current converter 140, and current controlled oscillator 150 includes MOS transistors having a gate that receives the common bias voltage VBS. In this case, the proportional values $\alpha$ and $\beta$ can be determined by a size of the each MOS transistor.

Figure 3:
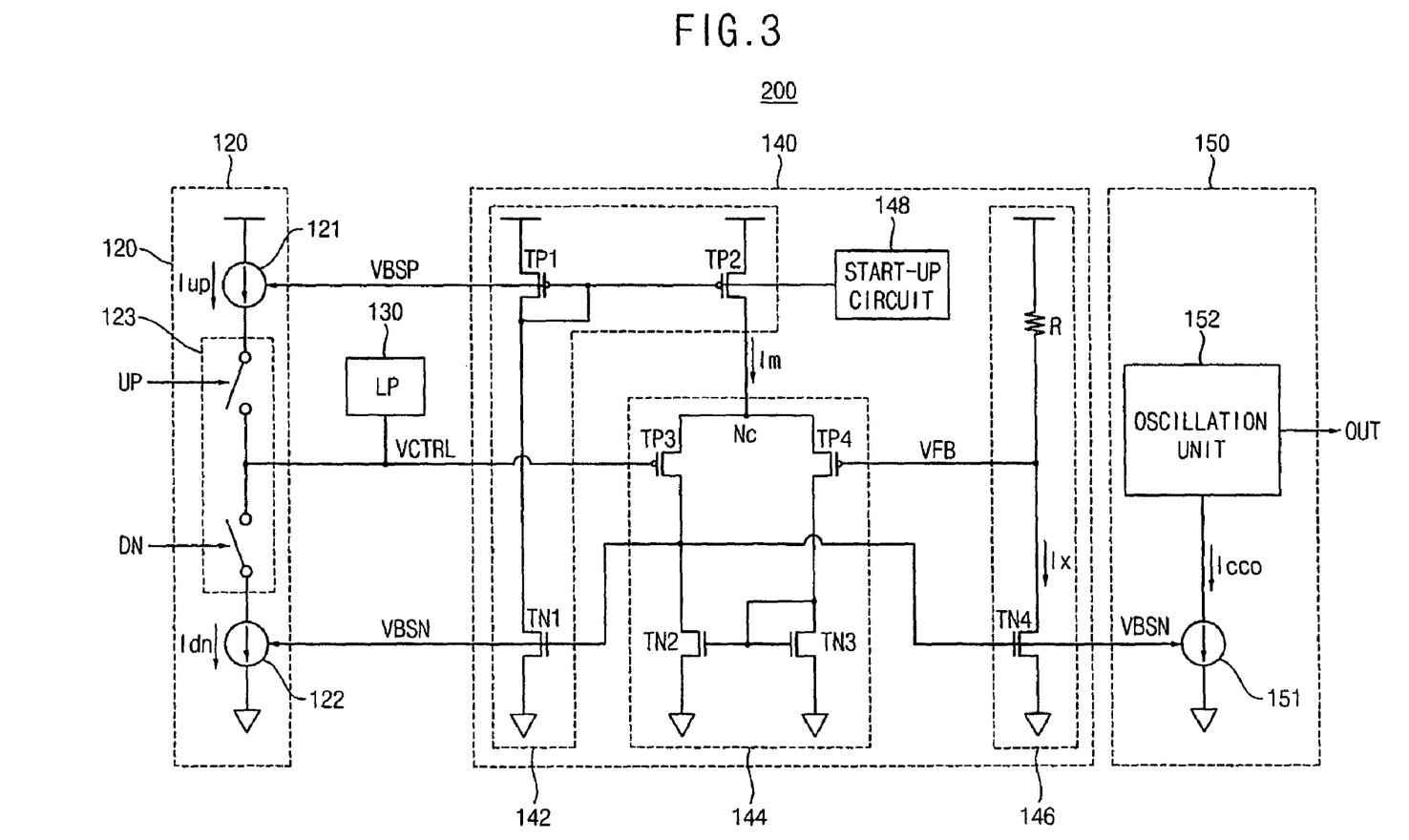
FIG. 3 is a circuit diagram illustrating an example embodiment of a PLL in accordance with aspects of the present invention.

FIG. 3 is a circuit diagram illustrating an example embodiment of a PLL in accordance with aspects of the present invention.

Referring to FIG. 3, the PLL 200 includes a charge pump 120, a voltage-current converter 140, a loop filter 130, and a current controlled oscillator 150. Since the PFD 110 and the main divider 160 in FIG. 2 can be implemented in various conventional configurations, the description of the PFD 110 and the main divider 160 in FIG. 2 will be omitted.

As shown in FIG. 3, a bias voltage VBS can include a first bias voltage VBSP and a second bias voltage VBSN. The voltage-current converter 140 can include a bias unit 142, an amplifying unit 144, and an output unit 146.

The bias unit 142 can include a CMOS structure that is self-biased by the first bias voltage VBSP and the second bias voltage VBSN. The CMOS structure includes a first transistor TP1 and a second transistor TN1. For example, the bias unit 142 can be implemented by using three transistors TP1, TN1, and TP2. The first transistor TP1 is diode-connected, and generates a voltage of a gate as the first bias voltage VBSP. The second transistor TN1 constitutes the CMOS structure with the first transistor TP1, and includes a gate that receives the second bias voltage VBSN. The third transistor TP2 constitutes a current mirror with the first transistor TP1, and outputs a first current Im that mirrors a current of the CMOS structure.

The amplifying unit 144 generates the second bias voltage VBSN based on the first current by comparing a control voltage VCTRL with a feedback voltage VFB. For example, the amplifying unit 144 can be implemented by using a MOS differential pair TP3 and TP4 connected to a common node NC that receives the first current Im. The MOS differential pair TP3 and TP4 can include a first transistor TP3 and a second transistor TP4. The first transistor TP3 includes a gate that receives the control voltage VCTRL, and the second transistor TP4 includes a gate that receives the feedback voltage VFB. The MOS differential pair TP3 and TP4 generates a voltage of a drain of the first transistor TP3 as the second bias voltage VBSN. The MOS differential pair TP3 and TP4 can be connected to the current mirror TN2 and TN3 as active loads.

The output unit 146 generates a converter current Ix and a feedback voltage VFB based on the second bias voltage VBSN. The output unit 146 can include a resistor R and a MOS transistor TN4 that are connected in series. The MOS transistor TN4 includes a gate that receives the second bias voltage VBSN and a drain that outputs the feedback voltage VFB.

An operation of the voltage-current converter 140 will be described hereinafter.

When a voltage of the control voltage VCTRL becomes higher than the feedback voltage VFB, a current that flows through a drain of the transistor TP3 becomes lower than a current that flows through a drain of the transistor TP4, and the second bias voltage VBSN decreases. As a result, the converter current Ix decreases and the feedback voltage VFB increases. When the control voltage VCTRL becomes lower than the feedback voltage VFB, the current that flows through the drain of the transistor TP3 becomes higher than the current that flows through the drain of the transistor TP4, and the second bias voltage VBSN increases. Thus, the converter current Ix increases and the feedback voltage VFB decreases. Finally, the feedback voltage VFB becomes stable being equal to the control voltage VCTRL.

In an early stage of a system operation, the voltage-current converter 140 can operate improperly since each gate of the transistors TP1 and TP2 in the bias unit 142 is in a floating state. In order to prevent the improper operation, the voltage-current converter 140 can further include a startup circuit 148 that controls the first bias voltage VBSP in the early stage of the system operation.

The charge pump 120 can include a first current source 121, a second current source 122, and a switching unit 123. The first current source 121 generates a first pump current Iup based on the first bias voltage VBSP. The second current source 122 generates a second pump current Idn based on the second bias voltage VBSN. The switching unit 123 is connected between the first current source 121 and the second current source 122, and selects one between the first pump current Iup and the second pump current Idn based on the phase difference detection signal UP and DN. For example, when the first pump current Iup is selected, the loop filter 130 is charged and the control voltage VCTRL increases. On the contrary, when the second pump current Idn is selected, the loop filter 130 is discharged and the control voltage VCTRL decreases.

The current controlled oscillator (CCO) 150 can include a current source 151 that generates an oscillator current Icco that is proportional to the converter current Ix based on the bias voltage VBSN, and an oscillating unit 152 that generates an output signal OUT based on the oscillator current Icco. The oscillating unit 152 can be implemented in various configurations. For example, the oscillating unit 152 can be implemented by using an inverter ring, where inverters are connected in series and an output of a last inverter is connected to an input of a first inverter as a feedback mechanism. Alternatively, the oscillating unit 152 can be implemented by using a differential inverter ring, where differential inverters are connected in series and an output of a last differential inverter is connected to an input of a first differential inverter as a feedback mechanism.

Figure 4:
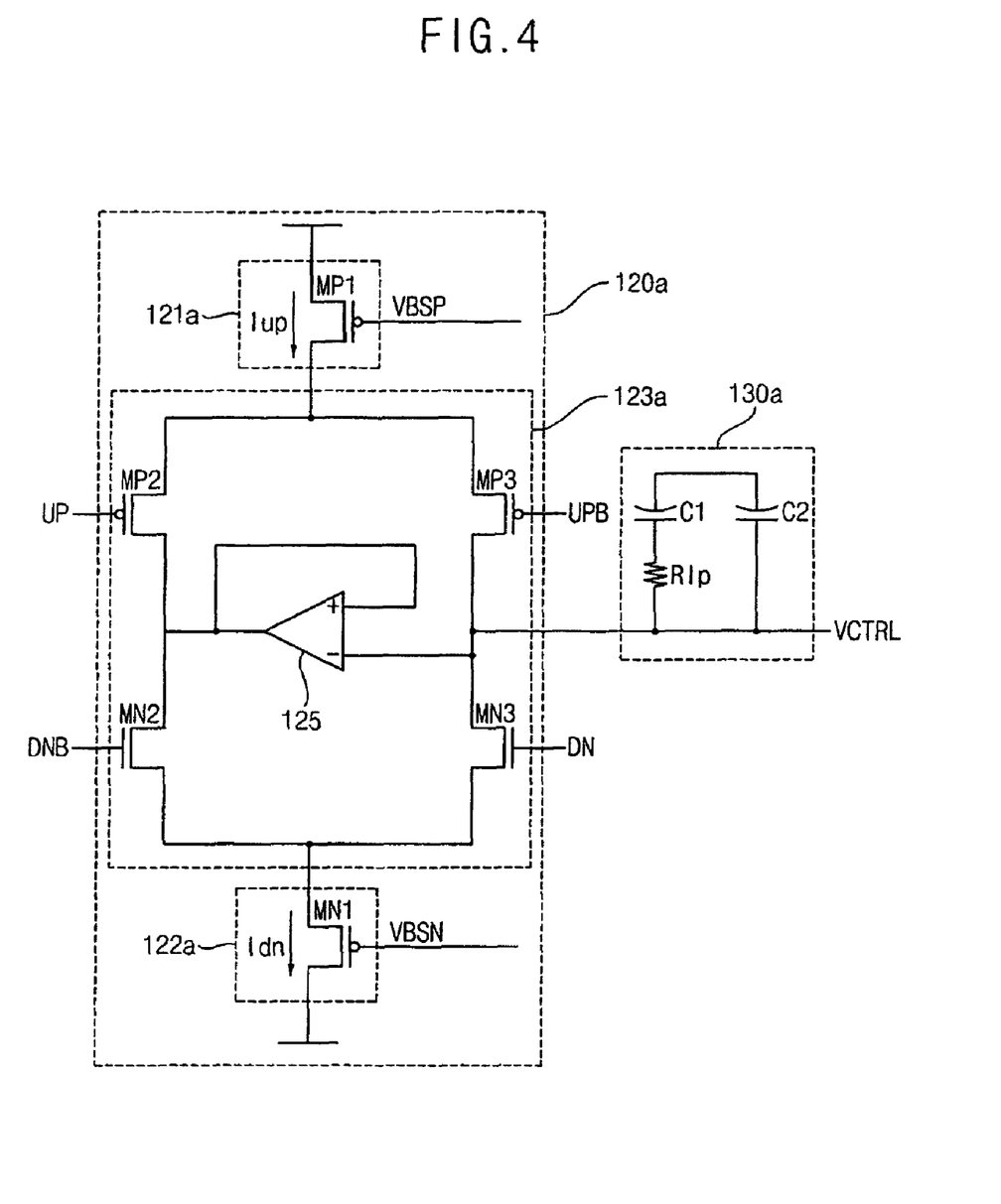
FIG. 4 is a circuit diagram illustrating an example embodiment of a charge pump and a loop filter that can be included in the PLL of FIG. 3.

FIG. 4 is a circuit diagram illustrating an example embodiment of a charge pump and a loop filter that can be included in the PLL of FIG. 3.

Referring to FIG. 4, a charge pump 120a can include a first current source 121a that includes a PMOS transistor MP1, a second current source 122a that includes a NMOS transistor MN1, and a switching unit 123a that is connected between the first current source 121a and the second current source 122a. The first current source 121a generates a first pump current Iup based on a first bias voltage VBSP. The second current source 122a generates a second pump current Idn based on a second bias voltage VBSN. The switching unit 123a can include a first CMOS structure including transistors MP2 and MN2 and a second CMOS structure including transistors MP3 and MN3. The first CMOS structure transistors MP2 and MN2 and the second CMOS structure transistors MP3 and MN3 are connected in parallel between the first current source 121a and the second current source 122a. The transistors MP2, MN2, MP3, and MN3 control the control voltage VCTRL by selecting between the first pump current Iup and the second pump current Idn, based on a phase difference detection signal UP and DN and an inverted signal UPB and DNB. A unit gain amplifier 125 can be connected between the first CMOS structure transistors MP2 and MN2 and the second CMOS structure transistors MP3 and MN3. The loop filter 130a can include a resistor Rlp and capacitors C1 and C2, which stabilize the control voltage VCTRL.

A conventional PLL needs a bias block that supplies a bias voltage, and a current source in a charge pump to generate a pump current based on a constant bias voltage. However, in a PLL according to an example embodiment of the present invention, the PLL does not need any bias block or an external bias voltage, and the bias voltage VBS that is applied to the charge pump is changed according to the control voltage VCTRL. Thus, in accordance with aspects of the present invention, a PLL that is insensitive to a division ratio and PVT variations can be implemented by generating a current corresponding to a loop dynamic. In addition, the bias block that is necessary in the conventional PLL can be omitted in the PLL, and a size of the capacitors in the loop filter can be reduced without any reduction of bandwidth. Therefore, a relatively small-sized PLL can be achieved.

Referring back to FIG. 2, a transfer function G(s) of the PLL 100 can be obtained as shown in Expression 4 below.

$$G(s) = \frac{\phi out}{\phi ref} \quad \text{[Expression 4]}$$

$$= \frac{\frac{Icp}{2\pi} \cdot H(s) \cdot \frac{\alpha}{R} \cdot \frac{Kcco}{s}}{1 + \frac{Icp}{2\pi} \cdot H(s) \cdot \frac{\alpha}{R} \cdot \frac{Kcco}{s} \cdot \frac{1}{M}}$$

$$= \frac{\frac{Icp \cdot Kcco \cdot \alpha}{2\pi \cdot Clp \cdot R} \cdot (1 + s \cdot Rlp \cdot Clp)}{s^2 + \frac{Icp \cdot Kcco \cdot Rlp \cdot \alpha}{2\pi \cdot M \cdot R} \cdot s + \frac{Icp \cdot Kcco}{2\pi \cdot M \cdot R \cdot Clp}}$$

$$H(s) \approx \frac{1 + s \cdot Rlp \cdot Clp}{s \cdot Clp}$$

In Expression 4, φref indicates a phase of a reference signal REF, φout indicates a phase of an output signal OUT, Icp indicates a pump current provided from the charge pump 120, H(s) indicates an approximate function of the transfer function of the loop filter 130, Kcco indicates a proportional constant of the current controlled oscillator 14, Clp indicates a capacitance of the loop filter 13, Rlp indicates a resistance of the loop filter 13, α indicates a proportional value related to Icco and Ix in Expression 3, and R is a resistance included in the output unit 146 of the voltage-current converter 140.

A linear current controlled oscillator model can be expressed as shown in Expression 5 below.

$$Fout = Kcco \cdot Icco + K \quad \text{[Expression 5]}$$

In Expression 5, Kcco indicates a slope of a straight line, and K indicates a y-axis intercept.

By using Expression 3, Expression 5, and the Expression Fout=M*Fref, the bandwidth wb of a PLL according to an example embodiment of the present invention can be obtained as shown in Expression 6 below.

$$wb = \left(1 - \frac{K}{Fout}\right) \cdot \frac{Icp}{Ix} \cdot \frac{Rlp}{R} \cdot Fref \quad \text{[Expression 6]}$$

$$= \eta \cdot \frac{Icp}{Ix} \cdot \frac{Rlp}{R} \cdot Fref$$

Since Icp/Ix=β and β is constant, wb in Expression 6 substantially depends upon only a frequency Fref of a reference signal REF. In addition, in case of same process, an influence of PVT variations on Rlp is substantially equal to an influence of the PVT variations on R. Therefore, an influence of the PVT variations on the constant wb can be reduced, as shown in Expression 6.

Figure 5:
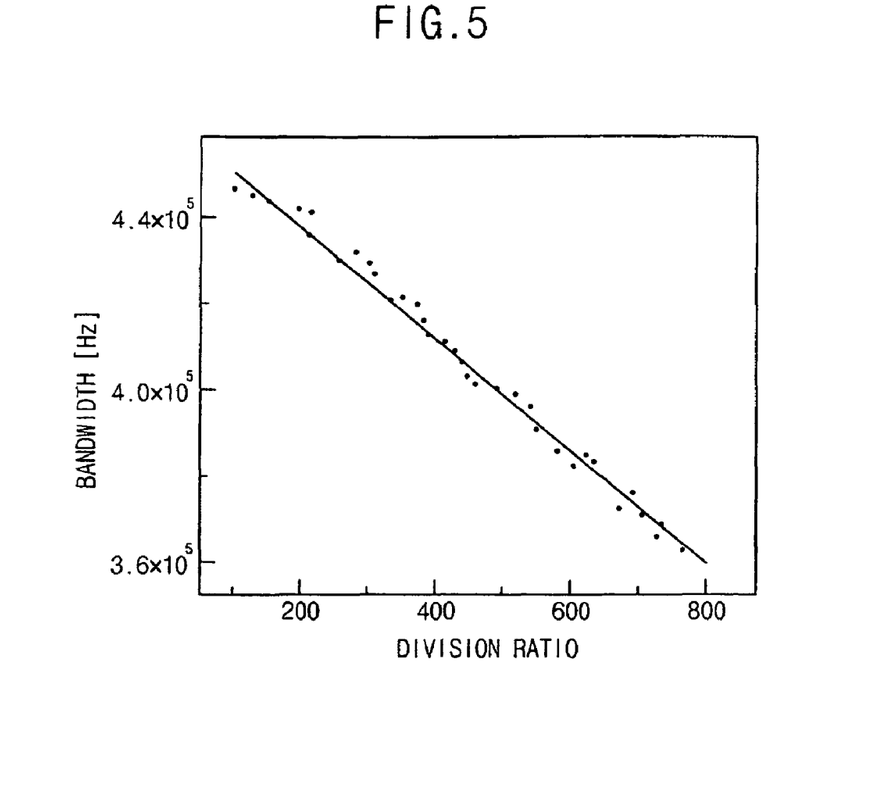
FIG. 5 is a graph illustrating a relationship between a division ratio and a bandwidth in a PLL in accordance with aspects of the present invention.

FIG. 5 is a graph illustrating a relationship between a division ratio and a bandwidth in a PLL in accordance with aspects of the present invention. In FIG. 5, data is represented with the dotted pattern, and a straight-line approximation of the data is also depicted on the graph.

Referring to FIG. 5, when a division ratio M increases about four times from, e.g., from about 200 to about 800, a bandwidth wb decreases and becomes about 0.82 times the initial value. As shown in Expression 2, the bandwidth wb is in inverse proportion to the division ratio M in the conventional PLL. Thus, when the division ratio increases about four times, the bandwidth wb decreases and becomes about ¼=0.25 times the initial value. Therefore, the PLL according to an example embodiment in accordance the present invention is more insensitive to a variation of the division ratio M, as compared to the conventional PLL.

Figure 6:
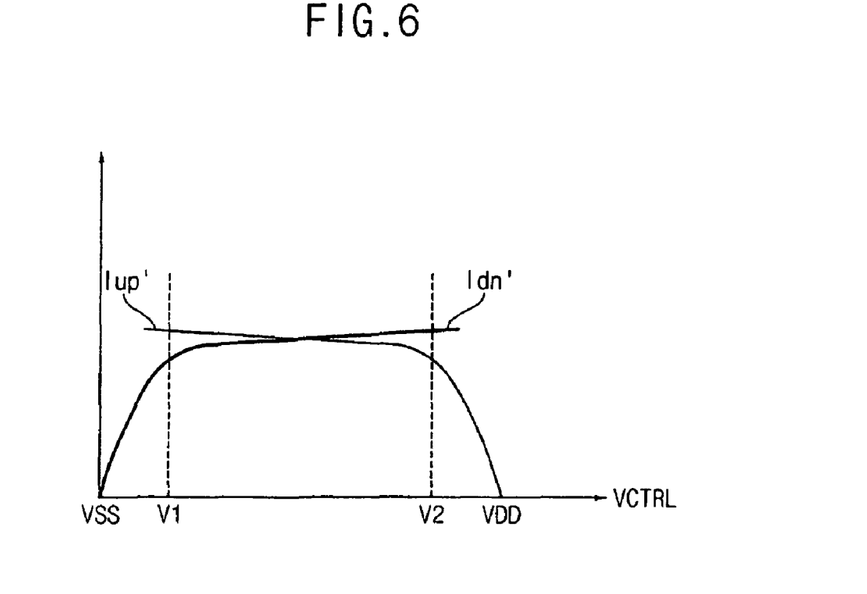
FIG. 6 is a graph illustrating an operational range of a conventional PLL.
Figure 7:
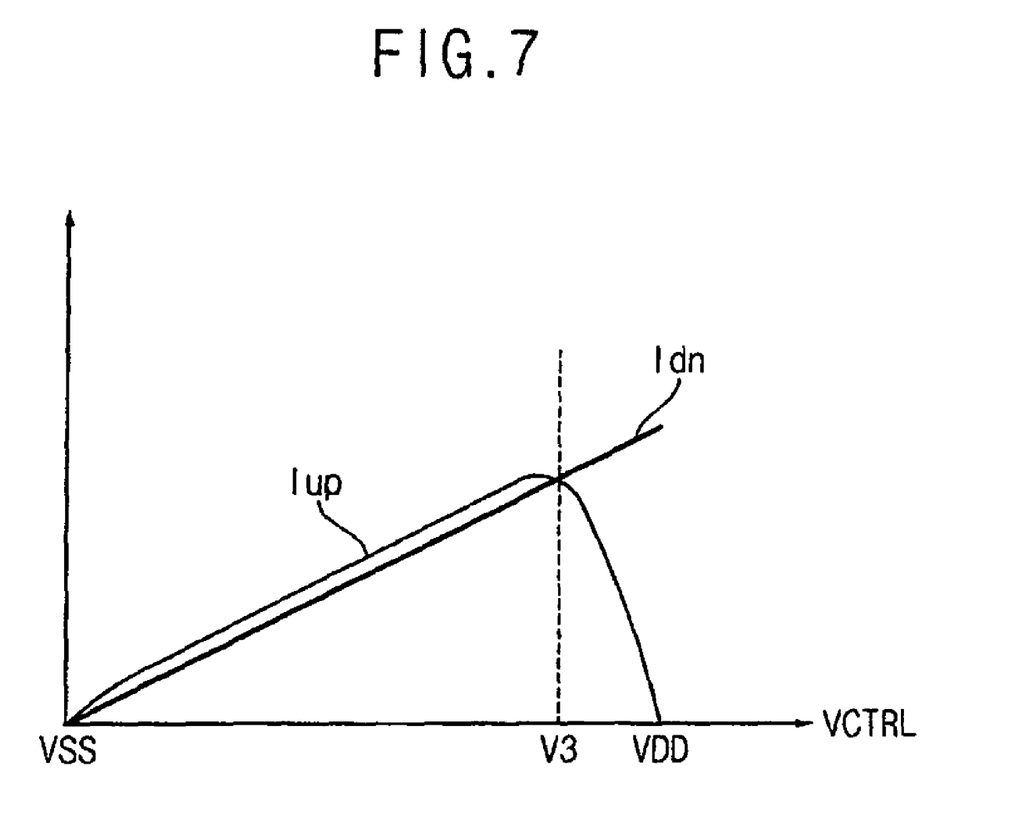
FIG. 7 is a graph illustrating an operational range of a PLL in accordance with aspects of the present invention.

FIG. 6 is a graph illustrating an operational range of a conventional PLL, and FIG. 7 is a graph illustrating an operational range of a PLL in accordance with aspects of the present invention.

Referring to FIG. 6, a current source in a charge pump of the conventional PLL supplies pump currents Iup and Idn based on a constant bias voltage. Thus, the charge pump operates in saturation region only when a control voltage VCTRL is between a lower limit voltage V1 and the upper limit voltage V2. On the contrary, in a PLL according to an example embodiment of the present invention, since bias voltages VBSP and VBSN are changed according to the control voltage VCTRL, the pump currents Iup and Idn are changed corresponding to a loop dynamic as shown in FIG. 7. Therefore, the efficiency of the PLL can be improved by eliminating a lower limit of the control voltage VCTRL.

Figure 8:
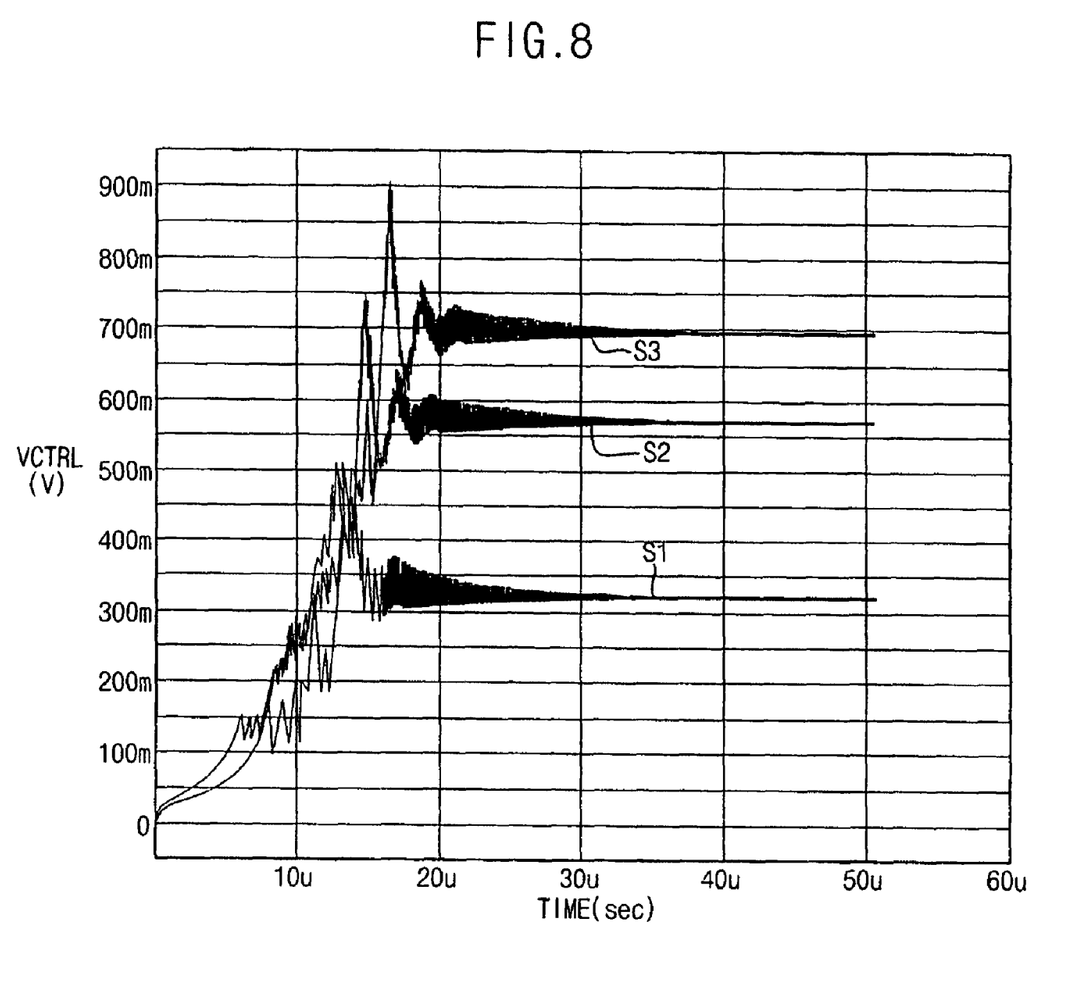
FIG. 8 is a graph illustrating a control voltage of a PLL in accordance with aspects of the present invention.

FIG. 8 is a graph illustrating a control voltage of a PLL according to an example embodiment in accordance with aspects of the present invention.

Plots S1, S2, and S3 in FIG. 8 show variations of the control voltage VCTRL according to various conditions. As shown in FIG. 8, the control voltage is stabilized rapidly, and the locking time is less than about 35 μsec, in this embodiment. Table 1 below shows the simulation conditions corresponding to each of the curve lines S1, S2, and S3.

TABLE 1

|    | Fref(MHz) | Fout(MHz) | Vdd(V) | Δφ(degree) | R       |
|----|-----------|-----------|--------|------------|---------|
| S1 | 2         | 200       | 1.0    | 55         | R       |
| S2 | 5         | 200       | 1.1    | 125        | 1.175 * R |
| S3 | 5         | 200       | 0.9    | 125        | 1.175 * R |

Figure 9:
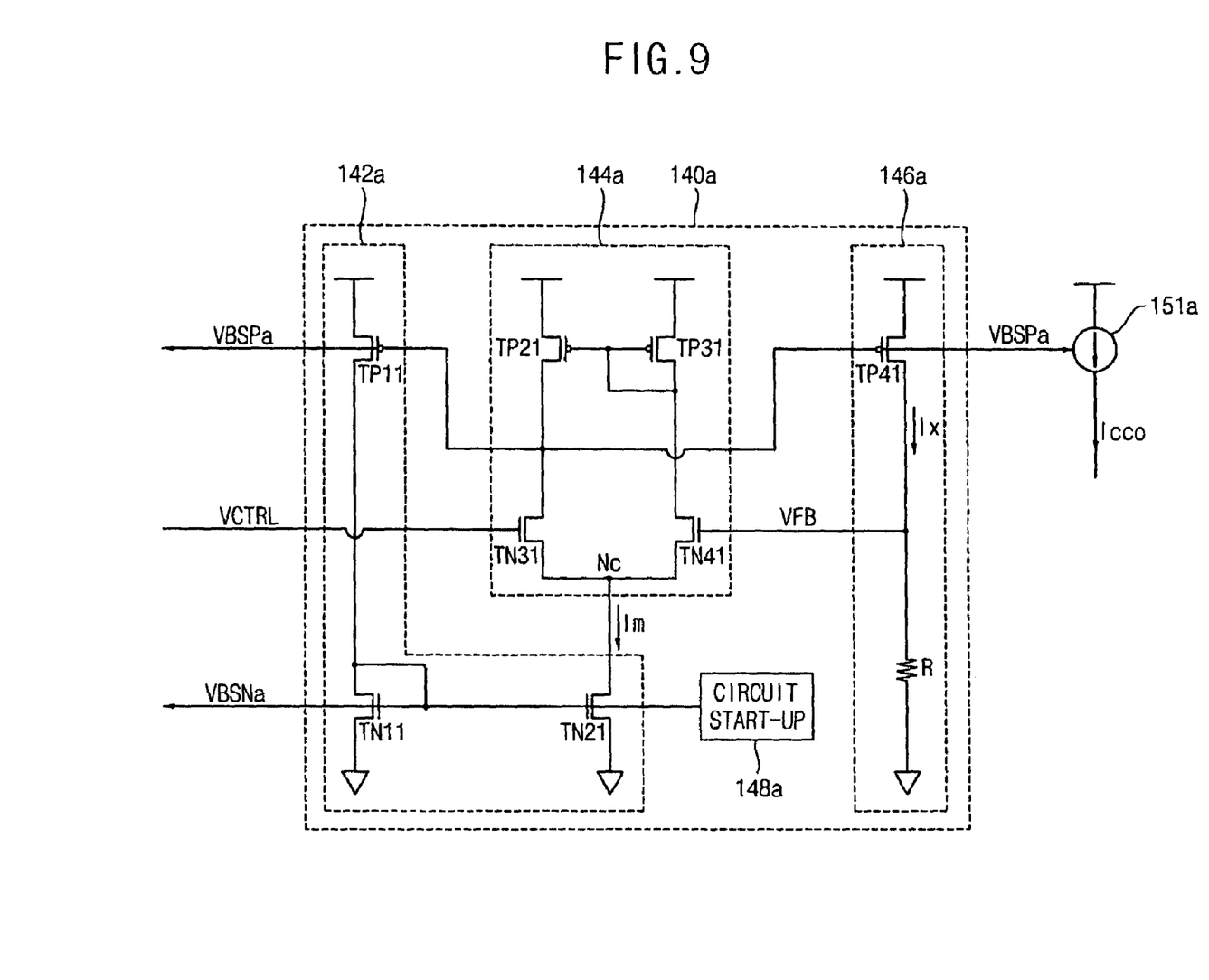
FIG. 9 is a circuit diagram illustrating an example embodiment of a voltage-current converter in a PLL in accordance with aspects of the present invention.

FIG. 9 is a circuit diagram illustrating an example embodiment of a voltage-current converter in a PLL in accordance with aspects of the present invention.

Referring to FIG. 9, the voltage-current converter 140a includes a bias unit 142a, an amplifying unit 144a, and an output unit 146a. The voltage-current converter 140a can further include a startup circuit 148a. A structure of the voltage-current converter 140a in FIG. 9 is upside-down symmetric with a structure of the voltage-current converter 140 in FIG. 3.

The bias unit 142a can include a CMOS structure including transistors TP11 and TN11 that is self-biased by a first bias voltage VBSNa and a second bias voltage VBSPa. For example, in this embodiment the bias unit 142a includes three transistors TP11, TN11, and TN21. The first transistor TN11 is diode-connected, and generates a voltage of a gate as the first bias voltage VBSNa. The second transistor TP11 with the first transistor TN11 constitutes the CMOS structure, including transistors TP11 and TN11, and includes a gate that receives the second bias voltage VBSPa. The third transistor TN21 constitutes a current mirror with the first transistor TN11, and outputs a first current Im that mirrors a current of the CMOS structure including transistors TP11 and TN11.

The amplifying unit 144a generates the second bias voltage VBSPa based on the first current Im by comparing a control voltage VCTRL with a feedback voltage VFB. For example, the amplifying unit 144a can include a MOS differential pair TN31 and TN41 that is connected to a common node Nc that receives the first current Im. The MOS differential pair TN31 and TN41 includes a first transistor TN31 and a second transistor TN41. A gate of the first transistor TN31 receives the control voltage VCTRL and a gate of the second transistor TN41 receives the feedback voltage VFB, and the MOS differential pair TN31 and TN41 generates a voltage of a drain of the first transistor TN31 as the second bias voltage VBSPa. The MOS differential pair TN31 and TN41 can be connected to a current mirror TP21 and TP31 as active loads.

The output unit 146a generates a converter current Ix and the feedback voltage VFB based on the second bias voltage VBSPa. For example, the output unit 146a can include a MOS transistor TP41 and a resistor R that are connected in series. The MOS transistor TP41 includes a gate that receives the second bias voltage VBSPa and a drain that outputs the feedback voltage VFB to the gate of transistor TN41. The second bias voltage VBSPa is also output from output converter 146a to a current source 151a that generates an oscillator current Icco that is proportional to the converter current Ix.

In accordance with aspects of the present invention, as demonstrated by the example embodiments provided in this disclosure, a phase locking method and a phase locked loop generate a bias voltage by using a self-biased voltage-current converter, and have characteristics insensitive to a division ratio and PVT variations, achieved by using a current corresponding to a loop dynamic generated based on the bias voltage.

In accordance with aspects of the present invention, a phase locking method and a phase locked loop are implemented in small size, operate at a low voltage, and reduce an operational range limit.

While the example embodiments of the present invention and their advantages have been described in detail, it should be understood that various changes, substitutions and alterations can be made herein without departing from the scope of the invention. It is intended by the following claims to claim that which is literally described and all equivalents thereto, including all modifications and variations that fall within the scope of each claim.

What is claimed is:

1. A phase locked loop, comprising:
a charge pump configured to generate a pump current based on a bias voltage and a phase difference detection signal, the pump current configured to adjust a control voltage;
a self-biased voltage-current converter configured to generate the bias voltage, and configured to convert the control voltage to a converter current; and
a current controlled oscillator configured to generate an oscillator current based on the bias voltage, and configured to generate an output signal that has a frequency corresponding to the oscillator current,
wherein each of the charge pump, the self-biased voltage-current converter, and the current controlled oscillator includes a MOS transistor having a gate configured to receive the bias voltage, and
wherein the bias voltage includes a first bias voltage and a second bias voltage, the self-biased voltage-current converter including:
a bias unit configured to generate the first bias voltage and a first current that mirrors a current of the bias unit;
an amplifying unit configured to generate the second bias voltage based on the first current by comparing the control voltage with a feedback voltage; and
an output unit configured to generate the converter current and the feedback voltage based on the second bias voltage.

2. The phase locked loop of claim 1, wherein the pump current, the oscillator current, and the converter current are proportional to each other.

3. The phase locked loop of claim 1, wherein each of the pump current, the oscillator current, and the converter current is proportional to each other and wherein each proportional value of the pump current, the oscillator current, and the converter current is determined by a size of the each MOS transistor having a gate configured to receive the bias voltage.

4. The phase locked loop of claim 1, wherein the voltage-current converter further includes a startup circuit configured to control the first bias voltage in an early stage of a system operation.

5. The phase locked loop of claim 1, wherein the bias unit includes:
a first transistor that is diode-connected and configured to generate a voltage of a gate as the first bias voltage;
a second transistor configured to form a CMOS structure with the first transistor, and including a gate configured to receive the second bias voltage; and
a third transistor configured to form a current mirror with the first transistor to output the first current.

6. The phase locked loop of claim 1, wherein the amplifying unit includes:
a MOS differential pair connected to a common node configured to receive the first current, the MOS differential pair configured to receive the control voltage and the feedback voltage, and configured to generate a voltage of a drain as the second bias voltage; and
a current mirror connected to the MOS differential pair.

7. The phase locked loop of claim 1, wherein the output unit includes a resistor and a MOS transistor that are connected in series, a gate of the MOS transistor configured to receive the second bias voltage, and the MOS transistor configured to generate a voltage of a drain as the feedback voltage.

8. The phase locked loop of claim 1, the charge pump including:
a first current source configured to generate a first pump current based on the first bias voltage;
a second current source configured to generate a second pump current based on the second bias voltage; and
a switching unit connected between the first current source and the second current source, and configured to select one of the first pump current and the second pump current as the pump current based on the phase difference detection signal.

9. The phase locked loop of claim 8, wherein the first bias voltage and the second bias voltage are changed according to the control voltage.

10. The phase locked loop of claim 2, wherein the current controlled oscillator includes:

a current source configured to generate the oscillator current that is proportional to the converter current based on the bias voltage; and an oscillating unit configured to generate the output signal based on the oscillator current.

11. A method of locking a phase of an output signal, comprising:

generating a pump current for adjusting a control voltage based on a bias voltage and a phase difference detection signal;

converting the control voltage to a converter current by generating the bias voltage using self-biasing;

generating an oscillator current based on the bias voltage; and generating the output signal with a frequency corresponding to the oscillator current, wherein the pump current is generated by a charge pump, the control voltage is converted to a converter current by a voltage-current converter, and the oscillator current is generated by a current controlled oscillator, each of the charge pump, voltage-current converter, and current controlled oscillator includes a MOS transistor having a gate configured to receive the bias voltage, and wherein the bias voltage includes a first bias voltage and a second bias voltage, and converting the control voltage to the converter current includes:

generating a reference current using the first bias voltage and the second bias voltage;

generating a first current by mirroring the reference current;

generating the second bias voltage based on the first current by comparing the control voltage with a feedback voltage; and generating the converter current and the feedback voltage based on the second bias voltage.

12. The method of claim 11, wherein the pump current, the oscillator current, and the converter current are proportional to each other.

13. The method of claim 11, wherein generating the pump current, converting the control voltage to the converter current, and generating the oscillator current includes:

applying the bias voltage to the gate of the MOS transistor configured to receive the bias voltage of each of the charge pump, voltage-current converter, and current controlled oscillator, wherein a size of the each MOS transistor having the gate configured to receive the bias voltage of the charge pump, voltage-current converter, and current controlled oscillator is chosen in order to make proportional the pump current, the oscillator current, and the converter current.

14. The method of claim 11, wherein generating the second bias voltage includes:

comparing the control voltage with the feedback voltage by using a MOS differential pair that is connected to a common node that receives the first current; and generating a voltage of a drain of a transistor in the MOS differential pair as the second bias voltage, the transistor receiving the control voltage.

15. The method of claim 11, wherein the bias voltage includes a first bias voltage and a second bias voltage, and generating the pump current includes:

generating a first pump current based on the first bias voltage;

generating a second pump current based on the second bias voltage; and selecting one of the first pump current and the second pump current based on the phase difference detection signal.

16. The method of claim 15, wherein the first bias voltage and the second bias voltage are changed according to the control voltage.

* * * * *